US012696402B2

(12) United States Patent
Wang et al.

(10) Patent No.: US 12,696,402 B2
(45) Date of Patent: Jul. 28, 2026

(54) DISPLAY DEVICE WITH INTERGRAL COMPOSITE TAPE

(71) Applicant: XIAMEN TIANMA DISPLAY TECHNOLOGY CO., LTD., Xiamen (CN)

(72) Inventors: Zhiwei Wang, Xiamen (CN); Yuzhong Luo, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 276 days.

(21) Appl. No.: 18/457,399

(22) Filed: Aug. 29, 2023

(65) Prior Publication Data

US 2023/0403804 A1      Dec. 14, 2023

(30) Foreign Application Priority Data

May 29, 2023    (CN) .......................... 202310613347.2

(51) Int. Cl.
*H05K 5/02* (2006.01)

(52) U.S. Cl.
CPC ..................................... *H05K 5/02* (2013.01)

(58) Field of Classification Search
CPC .......... G06F 1/1637; G09F 9/301; H05K 5/02
USPC ........................................................ 361/807
See application file for complete search history.

(56) References Cited

U.S. PATENT DOCUMENTS

| | | | | | |
|---|---|---|---|---|---|
| 8,853,562 | B2 * | 10/2014 | Izawa | .................. | H05K 9/0084 |
| | | | | | 156/60 |
| 12,185,517 | B2 * | 12/2024 | Zhang | .................. | G06F 1/1652 |

| | | | | | |
|---|---|---|---|---|---|
| 2017/0263890 | A1 * | 9/2017 | Chun | ................... | H10K 59/873 |
| 2024/0206305 | A1 * | 6/2024 | Kim | ....................... | H10K 59/90 |
| 2024/0404907 | A1 * | 12/2024 | Cai | ..................... | H10W 74/137 |
| 2025/0201152 | A1 * | 6/2025 | Wu | ......................... | G09F 9/301 |
| 2025/0212626 | A1 * | 6/2025 | Yang | ...................... | H05K 1/147 |

FOREIGN PATENT DOCUMENTS

| | | | | | |
|---|---|---|---|---|---|
| CN | 107484328 | B | * | 9/2019 | ............. H05K 1/189 |
| CN | 115116336 | A | * | 9/2022 | ............. G09F 9/301 |
| CN | 115762337 | A | | 3/2023 | |

OTHER PUBLICATIONS

Office Action of Corresponding CN Patent Application No. 202310613347.2 Dated May 20, 2025.

* cited by examiner

*Primary Examiner* — Imani N Hayman
*Assistant Examiner* — Ross Terry Mularski
(74) *Attorney, Agent, or Firm* — KILPATRICK TOWNSEND & STOCKTON LLP

(57)      ABSTRACT

A display device includes a display panel and a composite tape. The display panel includes a display part, a bendable part and a binding part. The display part includes a first surface and a second surface opposite to the first surface. The second surface includes a first region and a second region, and a vertical projection of the binding part on the second surface is located in the first region. The composite tape includes a first film structure and a second film structure, the first film structure is bonded with the second surface, the second film structure includes at least a first part, a vertical projection of the first part on the second surface is located in the first region, and the first part is bonded with the first film structure and the binding part.

18 Claims, 7 Drawing Sheets

DISPLAY DEVICE WITH INTERGRAL COMPOSITE TAPE

This application claims priority to Chinese Patent Application No. 202310613347.2, filed with the China National Intellectual Property Administration on May 29, 2023, and entitled "DISPLAY DEVICE", which is incorporated herein by reference in its entirety.

FIELD

The present disclosure relates to the field of electronic devices, and specifically, to a display device.

BACKGROUND

With the development of science and technology, more and more display devices are widely used in people's daily life and work, which bring great convenience to people's daily life and work, and have become an indispensable and important tool for people today. A main component of a display device to realize the display function is a display panel. In order to reduce the frame width of the display panel, a binding part bound with a control chip of the display panel is generally flipped over to the back of the display panel.

In an existing display device, multiple mutually independent tapes are used to bond structural parts in the display panel, which leads to a complicated structure and manufacturing process of the display device and a high manufacturing cost of the display device.

SUMMARY

In view of the above, a display device is provided according to the present disclosure.

The display device includes:

a display panel, where the display panel includes: a display part with a first surface and a second surface opposite to the first surface, where the first surface is a surface from which the display panel emits light; a bendable part and a binding part, where the bendable part is located between the display part and the binding part, the binding part is flipped over to face the second surface through the bendable part, and a surface of the binding part facing away from the display part is bound with a control chip, the second surface includes a first region and a second region, a vertical projection of the binding part on the second surface is located in the first region; and a composite tape, where at least a part of the composite tape is located between the display part and the binding part, the composite tape includes a first film structure and a second film structure, the first film structure is bonded to the second surface, the second film structure includes at least a first part, a vertical projection of the first part on the second surface is located in the first region, and the first part is bonded with the first film structure and the binding part.

Based on the above description, it can be seen that in the display device according to the present disclosure, the first film structure and the second film structure are different film structures in the same piece of composite tape, and one piece of composite tape is sufficient to cover and protect the second surface and to bond the binding part with a corresponding region of the display part, which simplifies the structure and manufacturing process of the display device, and reduces the manufacturing cost.

BRIEF DESCRIPTION OF DRAWINGS

In order to more clearly describe the embodiments of the present disclosure or the related art, the drawings used in the description of the embodiments or the conventional art are briefly described hereinafter. It is apparent that the drawings described merely shows some embodiments of the present disclosure.

The structures, scales and dimensions shown in the drawings of the specification are only used to cooperate with the content disclosed in the description, for those familiar with the art to understand and read, rather than limit the implementation of the present disclosure, and therefore are of no essence. Any modifications of the structures, changes of the scales and adjustments of the dimensions, if not impacting the effects and functions that can be achieve by the present disclosure.

DESCRIPTION OF EMBODIMENTS

The embodiments according to the present disclosure are clearly and completely described hereinafter with reference to the accompanying drawings in embodiments of the present disclosure. It is apparent that the described embodiments are merely some rather than all of embodiments of the present disclosure.

Various modifications and changes may be made in the application without departing from the spirit or scope of the present disclosure. Therefore, the present disclosure intends to cover the modifications and changes of the present disclosure falling within the scope of the corresponding claims (embodiments to be protected) and their equivalents. It should be noted that, the implementations according to the embodiments of the present disclosure may be combined with each other if there is no conflict therebetween.

Embodiments of the present disclosure can be made clearer, and the present disclosure is hereinafter described in more detail with the accompanying drawings and the embodiments.

Figure 1:
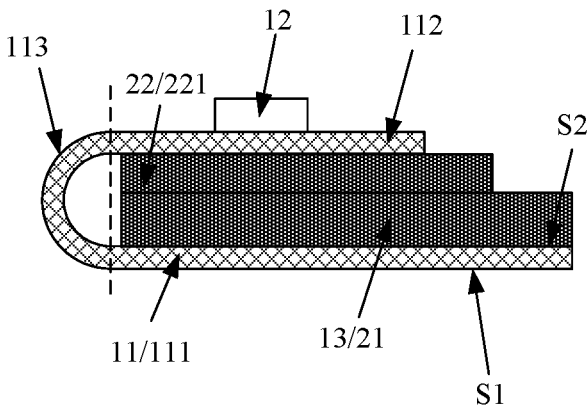
FIG. 1 is a cross-sectional view of a display device according to an embodiment of the present disclosure.
Figure 2:
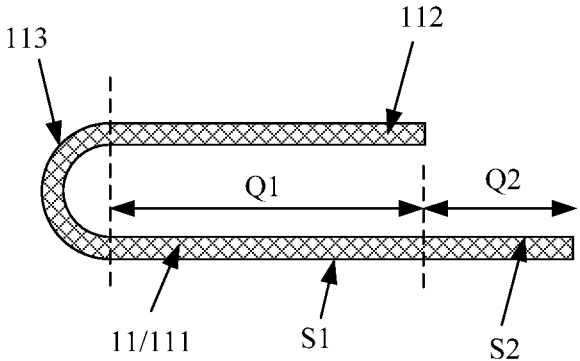
FIG. 2 is a cross-sectional view of a display panel in the display device shown in FIG. 1.

Referring to FIG. 1 and FIG. 2, FIG. 1 is a cross-sectional view of a display device according to an embodiment of the present disclosure, and FIG. 2 is a cross-sectional view of a display panel in the display device shown in FIG. 1. The display device includes a display panel 11 and a composite tape 13.

The display panel 11 includes a display part 111, a bendable part 113 and a binding part 112. The display part 111 includes a first surface S1 and a second surface S2 opposite to the first surface S1, where the first surface S1 is a surface of the display panel 11 to emit light. The bendable part 113 is located between the display part 111 and the binding part 112, the binding part 112 is flipped over to face the second surface S2 through the bendable part 113, and a surface of the binding part 112 facing away from the display part 111 is bonded with a control chip 12. The second surface S2 includes a first region Q1 and a second region Q2, and a vertical projection of the binding part 112 on the second surface S2 is located in the first region Q1.

At least a part of the composite tape 13 is located between the display part 111 and the binding part 112. The composite tape 13 includes a first film structure 21 and a second film structure 22, where the first film structure 21 is bonded to the second surface S2, and the second film structure 22 includes at least a first part 221. A vertical projection of the first part 221 on the second surface S2 is located in the first region Q1, and the first part 221 is bonded to the first film structure 21 and the binding part 112.

In a conventional display device, a first piece of tape is bonded on the second surface S2 of the display part 111 to at least protect the second surface S2 and to support structural components on the second surface S2, such as circuit boards and under-screen cameras; a second piece of tape is provided between the binding part 112 and the first piece of tape for bonding the binding part 112.

It should be noted that, in a direction from the first region Q1 to the second region Q2, a length of the second region Q2 is greater than a length of the first region Q1. In the cross-sectional views of the display panel 11 in the embodiments of the present disclosure, in order to illustrate the film structures of the composite tape 13 more clearly, a lengthwise dimension of the second region Q2 in this direction is not fully illustrated.

The first film structure 21 and the second film structure 22 are bonded at least in a part directly facing the first region Q1, and may be bonded with each other by an adhesive layer in this part, where the adhesive layer is not shown in FIG. 1.

In the display device according to the present disclosure, the first film structure 21 and the second film structure 22 are different film structures in the same piece of composite tape, and one piece of composite tape 13 is sufficient to cover and protect the second surface S2 and to bond the binding part 112 with a corresponding region of the display part 111, which simplifies the structure and manufacturing process of the display device, and reduces the manufacturing cost.

In an embodiment of the present disclosure, the display panel is a flexible display panel, such as an OLED (Organic Light Emitting Diode) panel or a small-scaled LED (Light Emitting Diode) panel. The light emitting element in the OLED panel is an OLED, the light emitting element in the small-scaled LED panel is a small-scaled LED, and the small-scaled LED includes a Mini LED or a Micro LED.

In the display panel, the display part 111, the bendable part 113 and the binding part 112 form an integral structure. After the binding part 112 is flipped over to face the second surface S2 based on the bendable part 113, the bendable part 113 is bent into an arcuate structure, and the binding part 112 and the display part 111 are still planar structures. After the binding part 112 is flipped over to face the second surface S2, the vertical projection of the binding part 112 on the display part 111 coincides with the first region Q1. The first region Q1 is a region of the second surface S2 directly facing the binding part 112, and the second region Q2 is a region of the second surface S2 excluding the first region Q1.

The second film structure 22 is at least configured to bond the binding part 112 and the first film structure 21. In a direction perpendicular to the display part 111, a bonding region of the second film structure 22 and the first film structure 21 may not overlap with the second area Q2. That is, a vertical projection of the bonding region on the second surface S2 is located in the first region Q1. Or, the bonding region of the second film structure 22 and the first film structure 21 overlaps with the second region Q2. That is, the vertical projection of the bonding region on the second surface S2 covers the first region Q1, as well as a region of the second region Q2 adjacent to the first region Q1.

In an embodiment of the present disclosure, the bonding region of the second film structure 22 and the first film structure 21 overlaps with the second region Q2, for example. As described in the following embodiments, based on this overlapping part, the second film structure 22 can be bonded to a flexible circuit board connected with the binding part 112.

In some the embodiments of the present disclosure, in a part of the composite tape 13 located between the binding part 112 and the display part 111, ends of the first film structure 21 and the second film structure 22 facing the bendable part 113 may be set to be flush with each other. As shown in FIG. 1, left ends of the first film structure 21 and the second film structure 22 are flush with each other, to facilitate a preparation process of the composite tape and aligned fitting and fixation with the display panel. In other embodiments, in the part of the composite tape 13 located between the binding part 112 and the display part 111, the ends of the first film structure 21 and the second film structure 22 facing the bendable part 113 may be non-flush with each other.

In some embodiments of the present disclosure, the part of the composite tape 13 between the binding part 112 and the display part 111 has no overlapping region with the bendable part 113. As shown in FIG. 1, the part of the composite tape 13 between the binding part 112 and the display part 113 is located to the right of a vertical dotted line. That is, the part of the composite tape 13 does not overlap with the bendable part 113, to protect the composite tape 13 from a bending stress by the bendable part 113 in a bent state, to avoid peeling-off of the composite tape 13 from the display panel caused by the stress.

Figure 3:
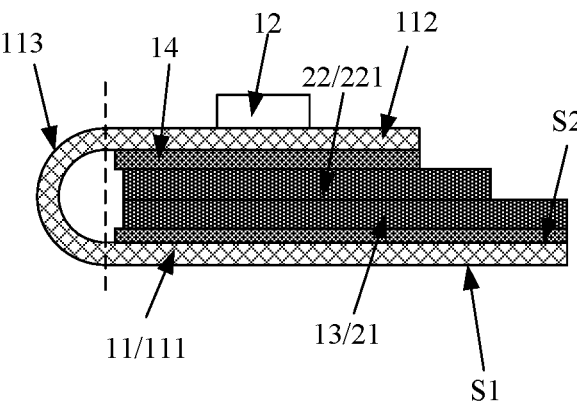
FIG. 3 is a cross-sectional view of another display device according to an embodiment of the present disclosure.

Referring to FIG. 3, FIG. 3 is a cross-sectional view of another display device according to an embodiment of the present disclosure. On a basis of the display device shown in FIG. 1, in the display device shown in FIG. 3, a protective layer 14 is provided on a side of the display panel facing away from the first surface S1. The protective layer 14 is located between the display part 111 and the composite tape 13, and between the binding part 112 and the composite tape 13, and the bendable part 113 is exposed from the protective layer 14. The protective layer 14 is provided on a non-display side of the display panel 11. The protective layer 14 at least includes a portion between the binding part 112 and the second film structure 22 and a portion between the first film structure 21 and the second surface S2, and the bendable part 113 is exposed from the protective layer 14. In an embodiment, the protective layer 14 is made of polyethylene terephthalate.

The protective layer 14 is configured to prevent the non-display side of the display panel 11 from being damaged. Before the binding part 112 is flipped over, the protective layer 14 is configured to protect the non-display side of the display panel 11 to avoid damage to the non-display side. After the binding part 112 is flipped over, the protective layer 14 is configured to prevent the non-display side of the display panel 11 from being damaged during the process of pasting the composite tape 13.

As shown in FIG. 3, in order to facilitate the bending of the bendable part 113, the protective layer 14 is provided with an opening at the bendable part 113. Based on the opening, the protective layer 14 does not cover the bendable part 113 to expose the bendable part 113, and the bendable part 113 is easy to bend.

It should be noted that the protective layer 14 may be provided or not provided on the surface of the display panel 11 as needed, which is not limited in the embodiments of the present disclosure.

Figure 4:
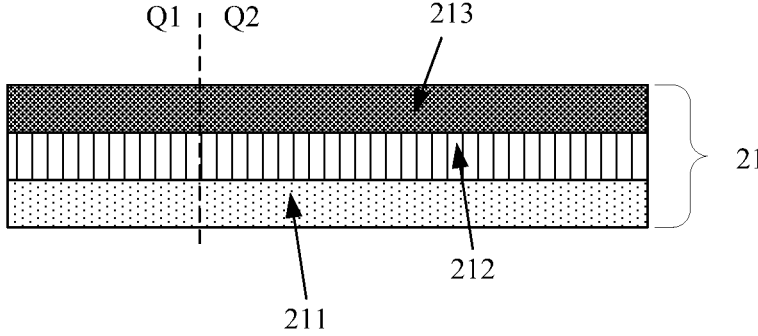
FIG. 4 is a cross-sectional view of a first film structure according to an embodiment of the present disclosure.

Referring to FIG. 4, FIG. 4 is a cross-sectional view of a first film structure according to an embodiment of the present disclosure. As shown in FIG. 2 and FIG. 4, in a direction from the first surface S1 to the second surface S2, the first film structure 21 includes a first adhesive layer 211, a first support and protection layer 212, and a first metal layer 213 stacked in sequence. The first film structure 21 is bonded to the second surface S2 through the first adhesive layer 211.

The first adhesive layer 211 is configured to bond the first film structure 21 to the second surface S2. The first adhesive layer 211 may be directly bonded to the second surface S2 of the display panel 11, or the first adhesive layer 211 may be bonded to the second surface S2 through the protective layer 14 on the non-display side of the display panel 11. The first support and protection layer 212 is configured to buffer a force received by the second surface S2. The first support and protection layer 212 may be a foam layer. The first metal layer 213 is configured to realize electromagnetic protection for the display panel 11, as well as uniform heat distribution of the non-display side of the display panel 11 to avoid local heat concentration. The first metal layer may be a copper foil or any other metal film.

The first film structure 21 covers the entire second surface S2. The first film structure 21 is configured to protect the second surface S2, and can also realize uniform heat distribution of the non-display side of the display panel 11, and a part of the first film structure 21 on the second region Q2 may also be configured to support structural components on the non-display side of the display panel.

As shown in FIG. 4, a part of the first adhesive layer 211 on the first region Q1 and a part of the first adhesive layer 211 on the second region Q2 form an integral structure. A part of the first support and protection layer 212 on the first region Q1 and a part of the first support and protection layer 212 on the second region Q2 form an integral structure. The integral structures of the first adhesive layer 211 and the first support and protection layer 212 simplify the structure and the manufacturing process of the composite tape 13.

As shown in FIG. 4, a part of the first metal layer 213 on the first region Q1 and a part of the first metal layer 213 on the second region Q2 may be provided as an integral structure, and the structure and the manufacturing process of the composite tape 13 are simple.

Figure 5:
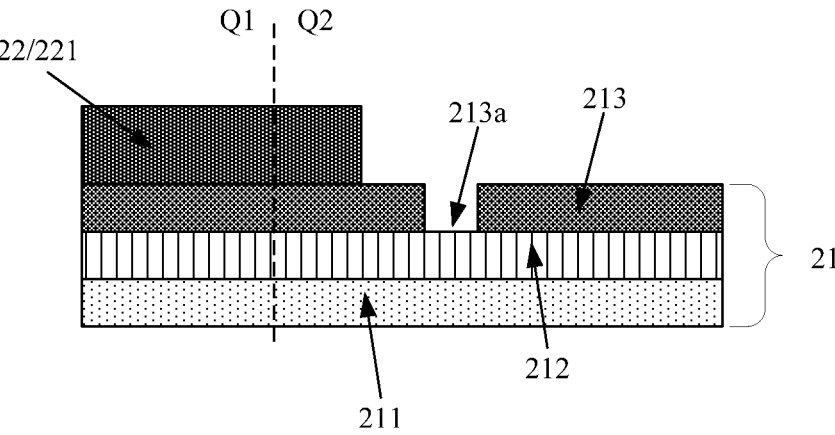
FIG. 5 is a cross-sectional view of another first film structure according to an embodiment of the present disclosure.

Referring to FIG. 5, FIG. 5 is a cross-sectional view of another first film structure according to an embodiment of the present disclosure. This embodiment differs from the embodiment according to in FIG. 4 in that the metal layer 213 includes a gap 213a, and the gap 213a is located outside the bonding region of the second film structure 22 and the first film structure 21. In the direction from the first region Q1 to the second area Q2 (from the left to the right in FIG. 5), a length of the first part 221 of the second film structure 22 is less than a length of the first film structure 21, the first part 221 is bonded to the first film structure 21, and the gap 213a is located outside a region where the first part 221 and the first film structure 21 are bonded. The bonding region of the second film structure 22 and the first film structure 21 is defined as a target region, and the gap 213a does not overlap with the target region.

Compared with the conventional method of attaching the first piece of tape on the second surface S2, and then bonding the binding part 112 with the first piece of tape through the second piece of tape, in the embodiments of the present disclosure, the second film structure 22 is a tape film of the composite tape 13, which can not only avoid the surface contamination of the first metal layer 213 in the first region Q1, but also improve the adhesion between the first part 221 and the first film structure 21, avoiding peeling-off of the composite tape 13 in the first region Q1.

As shown in FIG. 1 and FIG. 5, the second film structure 22 is configured to bond the binding part 112 and the first film structure 21. The binding part 112 applies a stress, directed from the first surface S1 to the second surface S2, to the first film structure 21 in the target region. Both the first support and protection layer 212 and the first adhesive layer 211 are made of a non-metallic material with good deformation properties, and can buffer stress based on the tensile deformation of their own thickness. The deformation performance of the first metal layer 213 made of a metal material is relatively poor, and cannot buffer the stress by the tensile deformation of its own thickness. In the first film structure 21 outside the target region, the first metal layer 213 is prone to warping under the stress, which further leads to peeling-off from adjacent films. The gap 213a can discontinue the first metal layer 213 in the target region from the first metal layer 213 outside the target region, preventing the first metal layer 213 outside the target region from being affected by the stress exerted by the binding part 112 on the composite tape 13, avoiding peeling-off of the first metal layer 213 outside the target area from the adjacent films.

Figure 6:
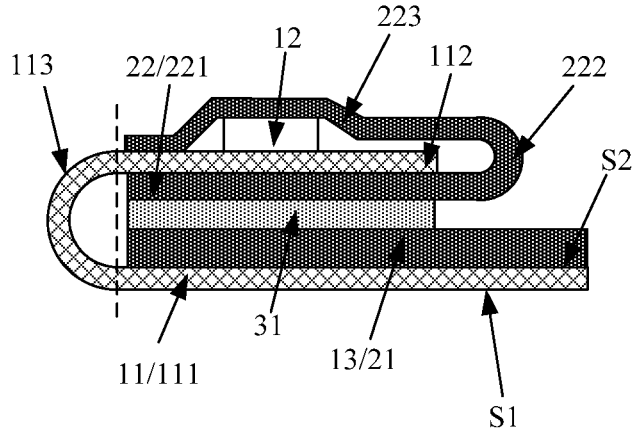
FIG. 6 is a cross-sectional view of yet another display device according to an embodiment of present disclosure.

Referring to FIG. 6, FIG. 6 is a cross-sectional view of yet another display device according to an embodiment of the present disclosure. In this embodiment, the second film structure 22 further includes a second part 222 and a third part 223. Two ends of the second part 222 are integrally connected with the first part 221 and the third part 223, respectively. The third part 223 is flipped over, by bending the second part 222, to the side of the binding part 112 facing away from the display part 111, to cover the control chip 12.

The first part 221 and the first film structure 21 are bonded by an adhesive layer 31. The adhesive layer 31 is a third adhesive layer hereinafter.

In the embodiment as shown in FIG. 6, there is no need for a separate tape to fix the control chip 12. A piece of composite tape is provided, which can not only cover and protect the second surface S2 and support the structural components, but also realize the bonding of the binding part 112 and the display part 111, as well as the bonding of the control chip 12.

In an embodiment, an end of the third part 223 away from the second part 222 straddles the control chip 12 and is bonded to the binding part 112. A bonding position of the end of the third part 223 and the binding part 112 does not overlap with the bendable part 113. The binding part 112 and the display part 111 are planar structures, and the bonding position of the end and the binding part 112 is not overlapped with the bendable part 113, and the end and the binding part 112 of the planar structure can be bonded, preventing bonding effects from being affected by a bending stress generated by the second film structure at the bonding position due to an overlapping region between the bonding position and the bendable part 113.

In an embodiment, the end of the third part 223 is bonded to the binding part 112, and a bonding position is located on a side of the control chip 12 closer to the bendable part 113. As shown in FIG. 6, the bonding position of the third part 223 and the binding part 112 is located between the vertical dotted line and the control chip 12. There is a gap between a part of the third part 223 located between the top of the control chip 12 and the second part 222 and the binding part 112, and the part of the third part 223 located between the top of the control chip 12 and the second part 222 has a smaller degree of deformation, reducing deformation stress. In another embodiment, the part of the third part 223 located between the top of the control chip 12 and the second part 222 may be bonded with the binding part 112.

Figure 7:
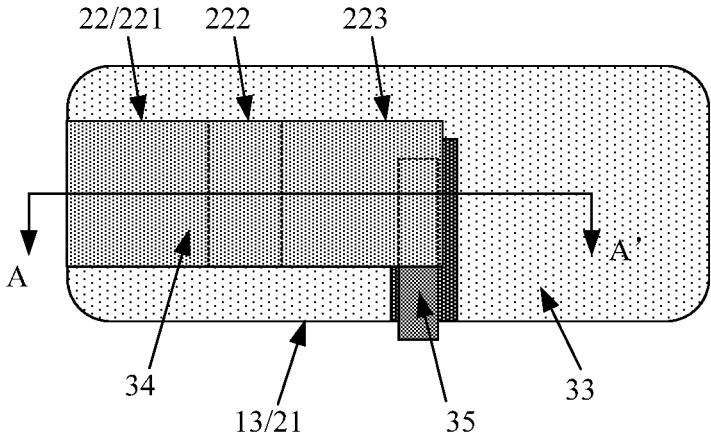
FIG. 7 is a top view of a composite tape according to an embodiment of the present disclosure.
Figure 8:
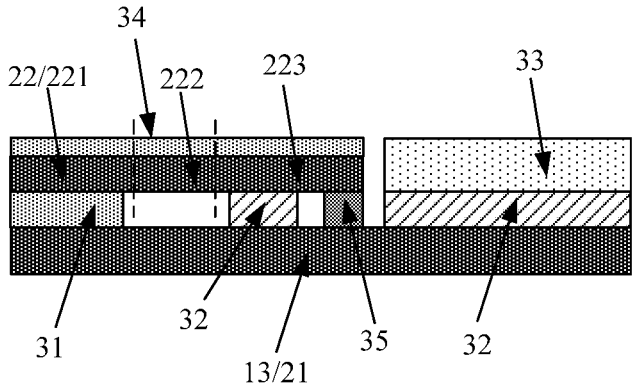
FIG. 8 is a cross-sectional view of the composite tape shown in FIG. 7 in A-A' direction.

Referring to FIG. 7 and FIG. 8, FIG. 7 is a top view of a composite tape according to an embodiment of the present disclosure, and FIG. 8 is a cross-sectional view of the composite tape shown in FIG. 7 in the A-A' direction. FIG. 7 and FIG. 8 show a flattened state of the composite tape 13 shown in FIG. 6 when it is not bonded to the display panel 11. As shown in FIG. 2 and FIGS. 6-8, the composite tape 13 includes the first film structure 21 and the second film structure 22 opposite to the first film structure 21.

A shape of the first film structure 21 matches a shape of the display part 111, and is attached to the second surface S2 of the display part 111. A width of the bendable part 113 and a width of the binding part 112 are smaller than a width of the display part 111, for ease of bending the binding part 112 to face the second surface S2. A width of the second film structure 22 matches the width of the bendable part 113 and the width of the binding part 112, and the second film structure 22 can be bonded to the back of the binding part 112 and cover the whole width of the binding part. Here, the back of the binding part 11 refers to a surface of the binding part 112 facing the display part 111 after bending.

The match between the shapes of the first film structure 21 and the display part 111 refers to that the shape of the first film structure 21 is the same or approximately the same as the shape of the display part 111, and the first film structure 21 covers the entire second surface S2. The match between the widths of the second film structure 22, the bendable part 113 and the binding part 112 refers to that the width of the second film structure 22 is the same or approximately the same as the widths of the bendable part 113 and the binding part 112. The width is a vertical dimension in FIG. 7.

The second film structure 22 can be bonded to a lower surface of the binding part 112 through the first part 221, and the third part 223 can be flipped over to the side of the control chip 12 facing away from the binding part 112 based on the bent second part 222, and the third part 223 can be bonded to the control chip 12 and a front surface of the binding part 112. Here, the front surface of the binding part 112 refers to a surface of the binding part 112 facing away from the display part 111 after bending. In the second film structure 22, lengths of the first part 221, the second part 222, and the third part 223 are set based on bonding requirements of the second film structure 22 and the display panel 11, which are not limited in this embodiment of the present disclosure as long as the bonding requirements of the second film structure 22 and the display panel 11 are satisfied. Here, the lengths are along a horizontal direction in FIG. 7.

Based on the shapes of the bendable part 113 and the binding part 112 relative to the display part 111 in the display panel 11, the length of the second film structure 22 is less than the length of the first film structure 21. As shown in FIG. 7, the width of the second film structure 22 is less than the width of the first film structure 21. The second film structure 22 is flush with an end of the first film structure 21 in the lengthwise direction and centered at this end of the first film structure. As shown in FIG. 7, the second film structure 22 is in a left middle region of the first film structure 21.

A first release film 32 is provided on a surface of the first film structure 21 facing the second film structure 22, and is in a same layer as the adhesive layer 31.

The first release film 32 includes a first part between the second film structure 22 and the first film structure 21. The first part of the first release film 32 can support the second part 222 and the third part 223 of the second film structure 22. When the composite tape 13 is not bonded to the display panel 11, the first part of the first release film 32 can make distances between the second film structure 22 and the first film structure 21 at different positions in the lengthwise direction the same or approximately the same, to facilitate the curling storage of the composite tape 13.

The first release film 32 also includes a second part that does not overlap with the second film structure 22. When the composite tape 13 is not bonded to the display panel 11, the second part of the first release film 32 can protect the first film structure 21 from contamination and damage.

The composite tape 13 further includes a cushion layer 33 located on a surface of the first release film 32 facing away from the first film structure 21, and the cushion layer 33 does not overlap with the second film structure 22. The cushion layer 33 is configured to enable a region of the composite tape 13 having the second film structure 22 to have the same or similar thickness as a region thereof outside the second film structure 22, to facilitate the curling storage of the composite tape 13.

The composite tape 13 also includes a second release film 34 covering the surface of the second film structure 22 facing away from the first film structure 21. When the composite tape 13 is not bonded to the display panel 11, the second release film 34 can protect the bonding surface of the second film structure 22 from contamination.

In an embodiment, the composite tape 13 further includes a film stripping structure 35 located between the first film structure 21 and the second film structure 22. The film stripping structure 35 extends in the widthwise direction of the composite tape 13 beyond a boundary of the first film structure 21. When the composite tape 13 is bonded to the display panel 11, the second part 222 and the third part 223 of the second film structure 22 can be separated from the first film structure 21 based on the film stripping structure 35, and after the third part 223 is flipped over based on the second part 222, the third part 223 can be bonded with the binding part 112 to cover and protect the control chip 12.

The first release film 32, the second release film 34, the cushion layer 33 and the film stripping structure 35 are all structural components of the composite tape 13 before it is bonded to the display panel 11, and are all removed after the composite tape 13 is bonded to the display panel.

In order to bend the second part 222 and the third part 223 can be flipped over to the side of the binding part 112 facing away from the display part 111, an elastic modulus of the second film structure 22 is set to be smaller than that of the first part 221 and that of the third part 223, to make the second film structure 22 easy to bend at the second part 222.

The second part 222 may further include an adjustment structure for increasing a bending capacity of the second part, and the second part 222 has a smaller elastic modulus than the first part 221 and the third part 223 and the second film structure 22 is easy to bend at the second part 222.

Figure 9:
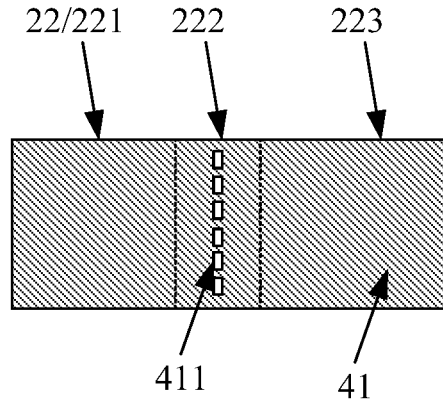
FIG. 9 is a top view of a second metal layer according to an embodiment of the present disclosure.

A first way to form the adjustment structure to facilitate bending at the second part 222 is shown in FIG. 9.

Referring to FIG. 9, FIG. 9 is a top view of a second metal layer according to an embodiment of the present disclosure. The second film structure 22 includes a second metal layer 41, and the second metal layer 41 includes a hollow region 411 as the adjustment structure in the second part 222, and the second film structure 22 can be bent at the second part 222. The second part 222 may have a perforation line, which includes multiple hollow regions 411 sequentially arranged in the widthwise direction.

Figure 10:
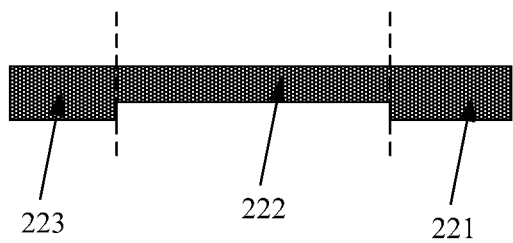
FIG. 10 is a schematic diagram of a second film structure according to an embodiment of the present disclosure.

A second way to form the adjustment structure to facilitate bending at the second part 222 is shown in FIG. 10.

Referring to FIG. 10, FIG. 10 is a schematic diagram of a second film structure according to an embodiment of the present disclosure. In this embodiment, a thickness of the second part 222 is smaller than a thickness of the first part 221 and a thickness of the third part 223, and the second part 222 has better bending properties compared with the first part 221 and the third part 223 and is easy to bend.

A third way to form the adjustment structure to facilitate bending at the second part 222 may be a combination of the first way and the second way as described above.

Figure 11:
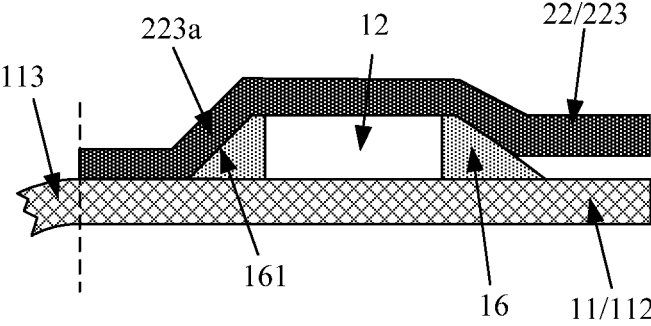
FIG. 11 is a partial enlarged view of a third part of the second film structure being bonded with the binding part and the control chip according to an embodiment of the present disclosure.

Referring to FIG. 11, FIG. 11 is a partially enlarged view of a third part of the second film structure being bonded with the binding part and the control chip according to an embodiment of the present disclosure. As shown in FIG. 6 and FIG. 11, a fixing adhesive 16 is provided on a side wall of the control chip 12, and has a slope 161, where the slope 161 extends from a top surface of the control chip 12 to the surface of the binding part 112 facing away from the display part 111. The third part 223 includes a slope region 223a bonded to the slope 161.

The fixing adhesive 16 surrounds the side wall of the control chip 12, and a width of the fixing adhesive 16 gradually decreases from the bottom of the control chip 12 to the top of the control chip 12, and the fixing adhesive 16 forms the slope 161. After the third part 223 is flipped over to the side of the control chip 12 facing away from the binding part 112, when the third part 223 is bonded with the binding part 112, it can be also bonded to the slope 161, and the slope 161 can support the slope region 223a and prevent the slope region 223a from being suspended, and can also improve the adhesion between the third part 223 and the binding part 112. It is easy to understand that a slope of the slope region 223a can be regulated based on the slope 161, and the third part 223 can form the slope region 223a with a suitable slope on both sides of the control chip 12, to avoid a large length of the third part 223 caused by a large slope, as well as excessive deformation stress and insufficient adhesion caused by a small slope.

Figure 12:
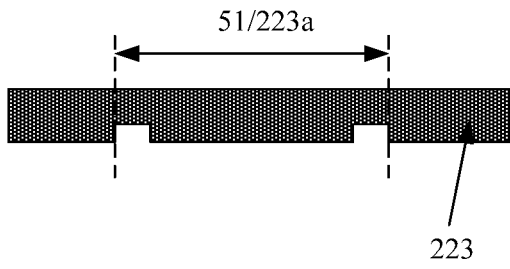
FIG. 12 is a partial side view of a third part in a second film structure according to an embodiment of the present disclosure.

Referring to FIG. 12, FIG. 12 is a partial side view of the third part in a second film structure according to an embodiment of the present disclosure, which is a schematic diagram of a flattened state of the third part 223 in the embodiment shown in FIG. 11. As shown in FIG. 11 and FIG. 12, the third part 223 has a first sub-region 51 for forming the slope region 223a. In the lengthwise direction of the third part 223, the first sub-region 51 includes a first end and a second end, where the first end is close to the top of the control chip 12, and the second end is close to the bottom of the control chip 12. A thickness of the third part 223 at the first end and the second end is smaller than a thickness of rest of the third part 223, to facilitate forming the slope region 223a by bending the first end and the second end with a smaller thickness.

In other embodiments, a hollow region may be provided at the first end and the second end to increase the bending properties, to facilitate forming the slope region 223a by bending at the first end and the second end. In a case that the second film structure 22 includes a third part 223 bonded to the binding part 112, the second film structure 22 is a laminated structure of multiple films, and at least one film in the third part 223 may include a hollow region at the first end and the second end. It is easy to understand that to facilitate forming the slope region 223a by bending the two ends of the first sub-region 51, the thickness of the third part 223 at the first end and the second end may be smaller than the thickness of the reset of the third part 223, and/or at least one film in the third part 223 may include a hollow region at the first end and the second end.

Figure 13:
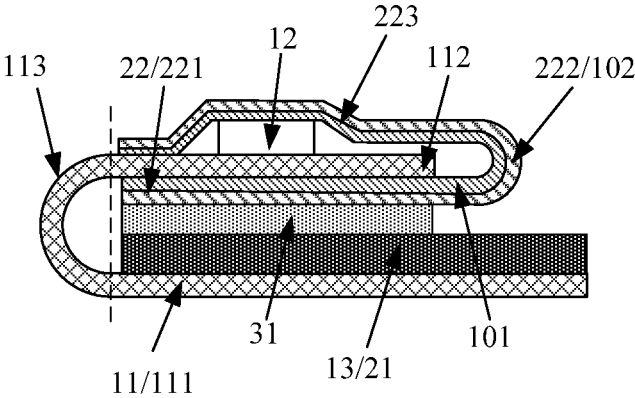
FIG. 13 is a schematic structural diagram of still another display device according to an embodiment of the present disclosure.

The structure of the second film structure 22 according to the embodiments shown in FIG. 6 to FIG. 12 may be as shown in FIG. 13.

Referring to FIG. 13, FIG. 13 is a schematic structural diagram of still another display device according to an embodiment of the present disclosure. The second film structure 22 includes a second adhesive layer 101 and a second metal layer 102 stacked in sequence. In the first part 221, the second adhesive layer 101 is bonded to the surface of the binding part 112 facing the display part 111, and the second metal layer 102 is bonded to the first film structure 21. In the third part 223, the second metal layer 102 is bonded to the surface of the binding part 112 facing away from the display part 111 through the second adhesive layer 101.

In the embodiment shown in FIG. 13, the second film structure 22 includes a second metal layer 102. After the second film structure 22 and the binding part 112 are bonded, the second metal layer 102 covers the control chip 12, which can provide electromagnetic protection for the control chip 12 and can improve the heat dissipation efficiency of the control chip 12. When heat generated by the control chip 12 is vertically conducted to the second metal layer 102, the heat can be quickly and laterally conducted away from the control chip 12 through the second metal layer 102, so the heat dissipation efficiency of the control chip 12 can be improved through the second metal layer 102.

As shown in FIG. 13, the first part 221 and the first film structure 21 are bonded by a third adhesive layer, and the third adhesive layer is the adhesive layer 31 described above. Based on the third adhesive layer, the first film structure 21 and the second film structure 22 can have a bonding region, to form the composite tape 13.

In a case that the second film structure 22 includes the second part 222 and the third part 223, a thickness of the second film structure 22 is set to be less than a thickness of the first film structure 21. In this way, at a given thickness of the composite tape 13, the second film structure 22 with a smaller thickness facilitates bending of a part of the second film structure 22 to the side of the binding part 112 facing away from the display part 111.

Figure 14:
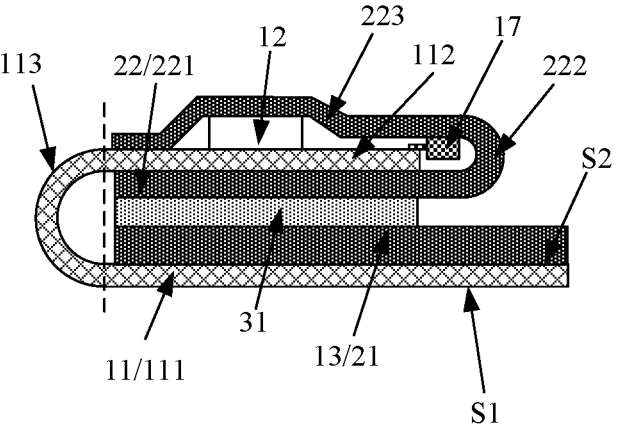
FIG. 14 is a cross-sectional view of still another display device according to an embodiment of the present disclosure.

Referring to FIG. 14, FIG. 14 is a cross-sectional view of still another display device according to an embodiment of the present disclosure. An end of the binding part 112 away from the bendable part 113 is connected with a flexible circuit board 17. A surface of the flexible circuit board 17 facing away from the display part 111 is bonded to the third part 223.

As noted above, in the conventional display device, a first piece of tape is bonded on the second surface S2 of the display part 111, to at least protect the second surface S2 and support the structural components on the second surface S2, such as the circuit boards and the under-screen camera; a second piece of tape is arranged between the binding part 112 and the first piece of tape, for bonding the binding part 112. In one embodiment, a third piece of tape is to further arranged between the flexible circuit board 17 and the first piece of tape, for bonding the flexible circuit board 17.

According to the embodiment as shown in FIG. 14, one piece of composite tape is sufficient to bond not only the second surface S2, but also the control chip 12 and the flexible circuit board 17 through the third part 223 of the second film structure 22. The piece of composite tape can replace the three pieces of tape in the conventional display device, which simplifies the structure and manufacturing process of the display device, and reduces the manufacturing cost.

Figure 15:
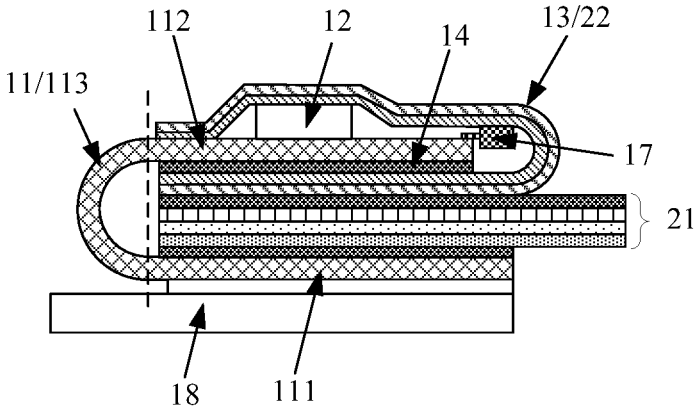
FIG. 15 is a cross-sectional view of still another display device according to an embodiment of the present disclosure.
Figure 16:
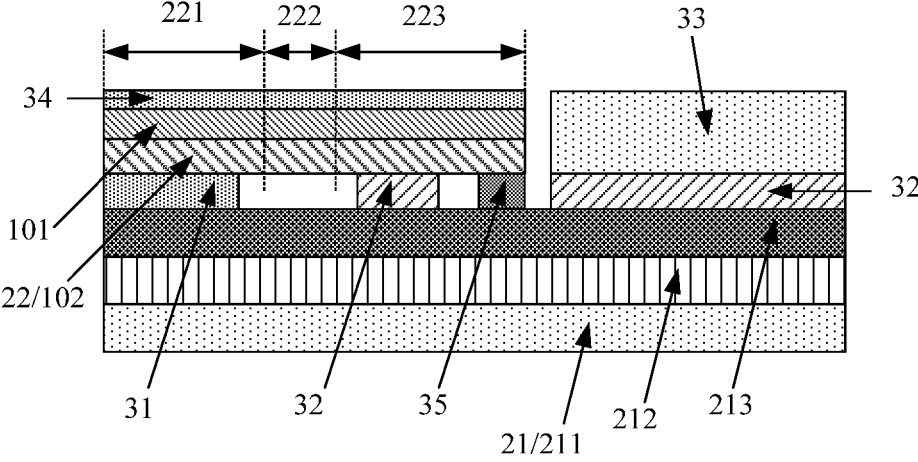
FIG. 16 is a cross-sectional view of a composite tape in the display device shown in FIG. 15.

Referring to FIG. 15 and FIG. 16, FIG. 15 is a cross-sectional view of still another display device according to an embodiment of the present disclosure, and FIG. 16 is a cross-sectional view of the composite tape in the display device shown in FIG. 15 and shows a flattened state of the composite tape 13 when the composite tape 13 is not bonded with the display panel 11. In this embodiment, when the composite tape 13 is not bonded with the display panel 11, the structure of the composite tape 13 in the flattened state is the same as that shown in FIGS. 7 and 8. The implementation of the first film structure 21 is the same as that shown in FIG. 4, and the implementation of the second film structure is the same as that in FIG. 13.

In the embodiment as shown in FIG. 15 and FIG. 16, the composite adhesive tape 13 is an integral structure, and can be used for bonding the binding part 112 and the display part 111, for protecting the second surface S2 and supporting the surface components, for the bonding of the flexible circuit board 17, and for the bonding of the control chip 12. The composite tape can realize the functions of the multiple pieces of tape in a conventional display device, which simplifies the structure and manufacturing process of the display device, and greatly reduces the manufacturing cost of the display device.

In a case that the second film structure 22 also includes a second part 222 and a third part 223, the composite tape 13 is an integral piecewise structure. The composite tape 13 is a double-sided tape structure at the first part 221 of the second film structure 22, which can be bonded between the binding part 112 and the display part 111. The second part 222 and the third part 223 of the second film structure 22 each are a single-sided tape structure, and the third part 223 can be bonded on the side of the binding part 112 facing away from the display part 111 by bending the second part 222, and protect the control chip 12. The other part than the bonding region of the first film structure 21 and the second film structure 22 is a single-sided tape structure, for bonding with the second surface S2.

Figure 17:
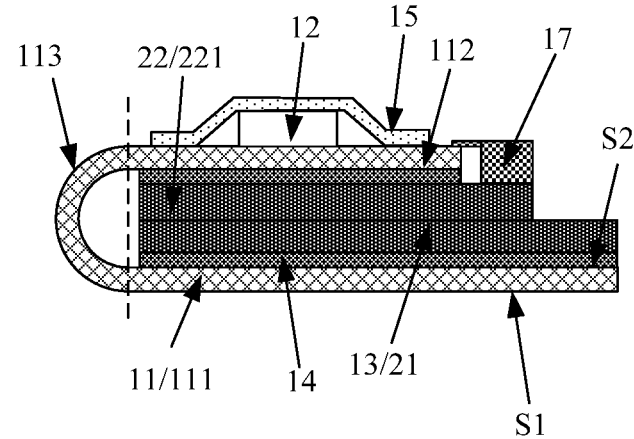
FIG. 17 is a cross-sectional view of still another display device according to an embodiment of the present disclosure.

The display devices shown in embodiments of the present disclosure may be as shown in FIG. 17. A light emitting side of the display panel 11 is provided with a cover 18, and the cover 18 may be a glass plate. The cover 18 is bonded to the display part 111 of the display panel 11 by optical glue.

Referring to FIG. 17, FIG. 17 is a cross-sectional view of still another display device according to an embodiment of the present disclosure. In this embodiment, the second film structure 22 of the composite tape 13 has a first area, and a bonding region of the first part 221 and the first film structure 21 has a second area, where the first area equals to the second area. In the embodiment, the second film structure 22 is completely bonded to the first film structure 21, and the first part 221 is the entire second film structure 22. In the embodiment, a separate chip fixing tape 15 is provided to bond the control chip 12.

The chip fixing tape 15 covers the control chip 12 and is bonded with the binding part 112. The chip fixing adhesive tape 15 is configured to bond the control chip 12, as well as sealing and protecting the control chip 12. In an embodiment, the chip fixing tape 15 includes at least an adhesive layer and a metal layer. The adhesive layer is configured to bond with the binding part 112. The metal layer is located on a side of the adhesive layer facing away from the control chip 12 for electromagnetic protection of the control chip 12. The metal layer can also improve the heat dissipation efficiency of the control chip 12.

As shown in FIG. 17, the end of the binding part 112 away from the bendable part 113 is connected to the flexible circuit board 17. In a direction perpendicular to the second surface S2, the first part 221 is located between the flexible circuit board 17 and the first film structure 21, and bonds the flexible circuit board 17 to the first film structure 21. In this embodiment, the first part 221 of the composite tape 13 can be reused to bond the flexible circuit board 17, without separately providing a tape for the flexible circuit board 17.

In other embodiments, in a case that the first area is equal to the second area, the first part 221 may be located outside a region where the flexible circuit board 17 directly faces the first film structure 21. That is, in the direction perpendicular to the second surface S2, there is no overlap between the first part 221 and the flexible circuit board 17. In this case, the flexible circuit board 17 may be fixed on the surface of the first film structure 21 through another tape separately arranged between the flexible circuit board 17 and the first film structure 21.

Compared with the embodiment shown in FIG. 6, the second film structure 22 according to the embodiment shown in FIG. 17 is completely attached to the surface of the first film structure 21 without the requirements for electromagnetic shielding and heat dissipation performance. Thus the second film structure may be an adhesive layer, without any metal layer.

In a case that the first area is equal to the second area, the structure of the first film structure 21 may be the same as in the above embodiments, which includes the first adhesive layer 211, the first support and protection layer 212 and the first metal layer 213 stacked in sequence.

Figure 18:
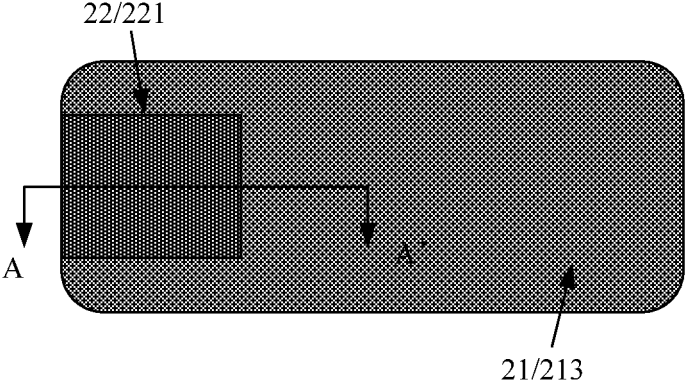
FIG. 18 is a top view of another composite tape according to an embodiment of the present disclosure.
Figure 19:
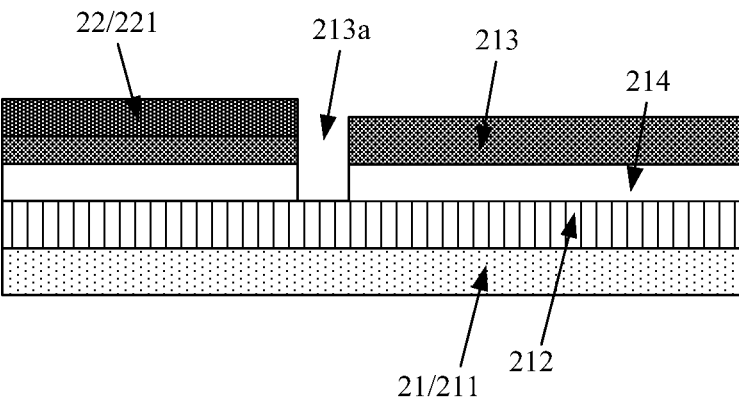
FIG. 19 is a cross-sectional view of the composite tape shown in FIG. 18 in the A-A' direction.

In a case that the first area is equal to the second area, the structure of the composite tape 13 when it is not bonded to the display panel 11 may be as shown in FIG. 18 and FIG. 19.

Referring to FIG. 18, FIG. 18 is a top view of another composite tape according to an embodiment of the present disclosure. FIG. 19 is a cross-sectional view of the composite tape shown in FIG. 18 in the A-A' direction. FIG. 18 and FIG. 19 shows a state of the composite tape 13 when it is not bonded to the display panel 11. In the embodiment, the structure of the first film structure 21 may be the same as in the above embodiments, which includes the first adhesive layer 211, the first support and protection layer 212 and the first metal layer 213 stacked in sequence. The first metal layer 213 and the first support and protection layer 212 are bonded through an adhesive layer 214. The whole of the second film structure 22 is the first part 221, and the second film structure 22 is an adhesive layer.

In the embodiment as shown in FIG. 18 and FIG. 19, the composite tape 13 has a piecewise design. The composite tape 13 is a double-sided tape structure at the second film structure 22, which is configured to bind the binding part 112 and the display part 111. The composite tape 13 is a single-sided tape structure outside the second film structure 22, which is used to bond with the second surface S2.

As shown in FIG. 19, in the first film structure 21, the first metal layer 213 includes a gap 213*a*, and the gap 213*a* is located outside the bonding region of the second film structure 22 and the first film structure 21, to reduce the stress on the first metal layer 213 in the composite tape 13 outside the second film structure 22. The gap 213*a* passes through the adhesive layer 214, exposing the first support and protection layer 212 under the adhesive layer 214. As noted above, the first metal layer 213 and the adhesive layer 214 may be provided as an integral structure, without the need to provide the gap 213*a*.

In an embodiment of the present disclosure, the first film structure 21 includes a first metal layer 213. The first metal layer 213 has a first thickness in a bonding region of the first film structure 21 and the first part 211, and has a second thickness outside the bonding region of the first film structure 21 and the first part 211, where the second thickness is greater than the first thickness. In other embodiment of the present disclosure, the first thickness may equal to the second thickness.

The composite tape 13 includes a first tape region and a second tape region. The first metal layer 213 has the first thickness in the first tape region, and has the second thickness in the second tape region. By setting the second thickness to be greater than the first thickness, the thickness of the adhesive layer in the first tape region can be increased at a given thickness of the composite tape, and the thickness of the first metal layer 213 can be reduced, while not only ensures the adhesion of the first tape region to the binding part 112, but also enables the bendable part 113 to have a small bending radius, reducing the thickness of the display device. In addition, by setting the second thickness to be greater than the first thickness, the second tape region can have greater mechanical strength, to ensure the compressive strength of the display part 111 at the second tape region.

As in the above-described embodiments, a region of the first metal layer 213 corresponding to the first part 221 is covered by the first part 221 of the second film structure 22 of the composite tape 13, which can prevent the surface of the first metal layer 213 in the region from being contaminated, and ensure the adhesion between the layers of the composite tape 13 in this region, avoiding peeling-off between these layers.

In the embodiment as shown in FIG. 19, the composite tape 13 can realize the bonding of the flexible circuit board 17, the protection of the second surface S2 and the support of the surface structural components, and the bonding of the binding part 112. In the conventional technology, three pieces of tape are provided to achieve the three objectives respectively. Thus, the embodiment of FIG. 19 simplifies the structure and manufacturing process of the display device, and reduces the manufacturing cost.

In any of the above-described embodiments of the present disclosure, the position of the bonding region of the first part 221 and the first film structure 21 relative to the binding part 112 may be configured as needed. The first part 221 has a first vertical projection on the second surface S2, and the binding part 112 has a second vertical projection on the second surface S2. The position of the bonding region of the first part 221 and the first film structure 21 relative to the binding part 112 may be configured in the following two manners.

In a first manner, the first vertical projection is located within the second vertical projection. In this case, an area of the first vertical projection is not larger than an area of the second vertical projection, and in the direction perpendicular to the second surface S2, the first part 221 is completely covered by the binding part 112.

In a second manner, the second vertical projection is located within the first vertical projection, and the area of the first vertical projection is larger than the area of the second vertical projection. In this case, in the direction perpendicular to the second surface S2, a portion of the first part 221, extending to outside the binding part 112, may be reused to bond the flexible circuit board 17.

The embodiments in this specification are described in a progressive manner, in parallel, or in a progressive-parallel-combined manner. Each embodiment focuses on the differences from the other embodiments, and reference may be made to each other for the same or similar parts.

It should be noted that, in the description of the present disclosure, it should be understood that the descriptions of the drawings and embodiments are illustrative rather than restrictive. The same reference numerals identify the same structures throughout the embodiments of the specification. In addition, for the sake of understanding and ease of description, the thickness of some layers, films, panels, regions, etc. may be exaggerated in the drawings. Also, it will be understood that when an element such as a layer, film, region, or substrate is referred to as being "on" another element, it can be directly on the other element or intervening elements may be present. In addition, "on" means positioning an element on or under another element, but does not essentially mean positioning on an upper side of another element according to the direction of gravity.

The orientation or positional relationship indicated by the terms "upper", "lower", "top", "bottom", "inner", "outer", etc. is based on the orientation or positional relationship shown in the drawings, and is only for the convenience of describing the present disclosure and simplified descriptions, rather than indicating or implying that the device or element referred to must have a specific orientation, or be constructed and operate in a specific orientation, and thus should not be construed as limiting the disclosure. When a component is said to be "connected" to another component, it may be directly connected to the other component or there may be a intervening component.

It should also be noted that in this disclosure, relational terms such as first and second etc. are only used to distinguish one entity or operation from one another, and do not necessarily require or imply that these entities or operations has any such actual relationship or sequence therebetween. Moreover, the term "include", "comprise" or any other variation thereof is intended to cover a non-exclusive inclusion and an article or device comprising a set of elements includes not only those elements but also other elements not expressly listed, or also include elements inherent to the article or device. Without further limitations, an element defined by the phrase "comprising a . . . " does not exclude the presence of additional identical elements in an article or device comprising the aforementioned element.

What is claimed is:

1. A display device comprising:
a display panel and a composite adhesive tape,
wherein the display panel comprises a display part, a bendable part and a binding part, wherein the display part comprises a first surface and a second surface opposite to the first surface, the first surface is a surface from which the display panel emits light,
the bendable part is located between the display part and the binding part, the binding part is flipped over to face the second surface through the bendable part, a surface of the binding part facing away from the display part is bound with a control chip, the second surface comprises a first region and a second region, a vertical projection of the binding part on the second surface is located in the first region,
at least a part of the composite adhesive tape is located between the display part and the binding part, the composite tape comprises a first film structure and a second film structure, the first film structure is bonded with the second surface, the second film structure comprises at least a first part, a vertical projection of the first part on the second surface is located in the first region, and the first part is bonded with the first film structure and the binding part,
wherein the second film structure further comprises a second part and a third part, two ends of the second part are integrally connected with the first part and the third part, respectively, and the third part is flipped over to a side of the binding part facing away from the display part by bending the second part, to cover the control chip, wherein the third part is located on the side of the binding part facing away from the display part.

2. The display device according to claim 1, wherein the first film structure comprises a first adhesive layer, a first support and protection layer and a first metal layer, in a direction from the first surface to the second surface, and the first film structure is bonded to the second surface through the first adhesive layer.

3. The display device according to claim 2, wherein a part of the first adhesive layer on the first region and a part of the first adhesive layer on the second region form an integral structure, and a part of the first support and protection layer on the first region and a part of the first support and protection layer on the second region form an integral structure.

4. The display device according to claim 3, wherein a part of the first metal layer on the first region and a part of the first metal layer on the second region form an integral structure.

5. The display device according to claim 2, wherein the first metal layer comprises a gap, and the gap is located outside a bonding region of the second film structure and the first film structure.

6. The display device according to claim 1, wherein an elastic modulus of the second part is smaller than an elastic modulus of the first part and an elastic modulus of the third part.

7. The display device according to claim 1, wherein the second part comprises an adjustment structure for increasing a bending capability of the second part.

8. The display device according to claim 7, wherein the second film structure comprises a second metal layer, and the second metal layer comprises a hollow region as the adjustment structure in the second part; and/or,
a thickness of the second part is smaller than a thickness of the third part and a thickness of the first part.

9. The display device according to claim 1, wherein a side wall of the control chip is provided with a fixing adhesive, the fixing adhesive comprises a slope, the slope extends from a top surface of the control chip to the surface of the binding part facing away from the display part, and the third part comprises a slope region bonded to the slope.

10. The display device according to claim 9, wherein the third part comprises a first sub-region for forming the slope region, the first sub-region comprises a first end and a second end in a lengthwise direction of the third part, the first end is close to a top of the control chip, and the second end is close to a bottom of the control chip,
wherein a thickness of the third part at the first end and the second end is smaller than a thickness of rest of the third part; and/or,
the third part is a laminated structure of a plurality of films, and at least one of the plurality of films comprises a hollow region at the first end and the second end.

11. The display device according to claim 1, wherein an end of the third part away from the second part straddles the control chip and is bonded with the binding part, and a bonding position of the end and the binding part does not overlap with the bendable part.

12. The display device according to claim 1, wherein the second film structure comprises a second adhesive layer and a second metal layer stacked;
in the first part, the second adhesive layer is bonded to a surface of the binding part facing the display part, and the second metal layer is bonded to the first film structure;
in the third part, the second metal layer is bonded to the surface of the binding part facing away from the display part through the second adhesive layer.

13. The display device according to claim 1, wherein an end of the binding part away from the bendable part is connected with a flexible circuit board, and a surface of the flexible circuit board facing away from the display part is bonded to the third part.

14. The display device according to claim 1, wherein the first film structure comprises a first metal layer, the first metal layer has a first thickness in a bonding region of the first film structure and the first part, and has a second thickness outside the bonding region of the first film structure and the first part, wherein the second thickness is greater than the first thickness.

15. The display device according to claim 1, wherein the second film structure is an adhesive layer.

16. The display device according to claim 1, wherein in a part of the composite tape between the binding part and the display part, ends of the first film structure and the second film structure, facing the bendable part, are flush with each other; or a part of the composite tape between the binding part and the display part has no overlapping region with the bendable part.

17. The display device according to claim 1, wherein a protective layer is provided on a side of the display panel facing away from a display surface, wherein the protective layer is located between the display part and the composite tape, and between the binding part and the composite tape, and the bendable part is exposed from the protective layer.

18. A display device comprising:

a display panel and a composite adhesive tape, wherein the display panel comprises a display part, a bendable part and a binding part, wherein the display part comprises a first surface and a second surface opposite to the first surface, the first surface is a surface from which the display panel emits light, the bendable part is located between the display part and the binding part, the binding part is flipped over to face the second surface through the bendable part, a surface of the binding part facing away from the display part is bound with a control chip, the second surface comprises a first region and a second region, a vertical projection of the binding part on the second surface is located in the first region, at least a part of the composite adhesive tape is located between the display part and the binding part, the composite tape comprises a first film structure and a second film structure, the first film structure is bonded with the second surface, the second film structure comprises at least a first part, a vertical projection of the first part on the second surface is located in the first region, and the first part is bonded with the first film structure and the binding part, wherein the second film structure has a first area, and a bonding region of the first part and the first film structure has a second area, wherein the first area is equal to the second area, wherein an end of the binding part away from the bendable part is connected with a flexible circuit board;

in a first direction perpendicular to the second surface, the first part is located between the flexible circuit board and the first film structure, and bonds the flexible circuit board and the first film structure, wherein the first part comprises a first sub-part and a second sub-part, the first part is longer than the binding part in a second direction parallel to the second surface, the second sub-part protrudes from the end of the binding part away from the bendable part in the second direction, and the flexible circuit board is in direct contact with the second sub-part protruding from the end of the binding part.

* * * * *